(12) United States Patent
Yee (10) Patent No.: US 6,483,177 B1
(45) Date of Patent: Nov. 19, 2002

(54) LEADED SEMICONDUCTOR PACKAGES AND METHOD OF TRIMMING AND SINGULATING SUCH PACKAGES

(75) Inventor: Jae Hak Yee, Singapore (SG)

(73) Assignee: ST Assembly Test Services Ltd, Singapore (SG)

( * ) Notice: Subject to any disclaimer, the term of this patent is extended or adjusted under 35 U.S.C. 154(b) by 0 days.

(21) Appl. No.: 09/705,251

(22) Filed: Nov. 2, 2000

(30) Foreign Application Priority Data

Oct. 9, 2000 (SG) ......................................... 200005737

(51) Int. Cl.⁷ ............................................. H01L 23/495
(52) U.S. Cl. ........................................ 257/670; 257/666
(58) Field of Search ................................ 257/666, 676, 257/696, 668, 674, 670

(56) References Cited

U.S. PATENT DOCUMENTS

| | | |
|---|---|---|
| 3,708,730 A | 1/1973 | Schierz et al. |
| 4,307,297 A | 12/1981 | Groff et al. |
| 4,612,564 A | 9/1986 | Moyer |
| 4,791,473 A | 12/1988 | Phy |
| 4,829,362 A | 5/1989 | Tran et al. |
| 4,868,635 A | 9/1989 | Frechette et al. |
| 5,162,895 A | 11/1992 | Takahashi et al. |
| 5,286,679 A | 2/1994 | Farnworth et al. |
| 5,327,008 A | 7/1994 | Djennas et al. |
| 5,428,248 A | 6/1995 | Cha |
| 5,521,428 A | 5/1996 | Hollingsworth et al. |
| 5,674,785 A | 10/1997 | Akram et al. |
| 5,714,792 A | 2/1998 | Przano |
| 5,729,049 A | 3/1998 | Corisis et al. |
| 5,739,585 A | 4/1998 | Akram et al. |
| 5,789,803 A | 8/1998 | Kinsman |
| 5,893,723 A | 4/1999 | Yamanaka |
| 5,915,166 A | 6/1999 | Corisis et al. |
| 5,920,116 A | 7/1999 | Umehara et al. |
| 5,926,380 A | 7/1999 | Kim |
| 5,939,777 A | 8/1999 | Zuniga |
| 5,945,731 A | 8/1999 | Iino |
| 5,949,132 A | 9/1999 | Libres et al. |
| 5,977,615 A | 11/1999 | Yamaguchi et al. |
| 5,990,544 A | 11/1999 | Ohshima |
| 6,008,528 A | 12/1999 | Go et al. |
| 6,017,776 A | 1/2000 | Jiang et al. |
| 6,025,642 A | 2/2000 | Burns |
| 6,028,350 A | 2/2000 | Sabyeying |
| 6,043,109 A | 3/2000 | Yang et al. |
| 6,043,111 A | 3/2000 | Furuse |
| 6,069,025 A | 5/2000 | Kim |
| 6,072,236 A | 6/2000 | Akram et al. |
| 6,072,239 A | 6/2000 | Yoneda et al. |
| 6,075,283 A * | 6/2000 | Kinsman et al. ............. 257/676 |
| 6,075,290 A | 6/2000 | Schaefer et al. |
| 6,075,358 A | 6/2000 | Hetzel et al. |
| 6,075,710 A | 6/2000 | Lau |
| 6,157,074 A * | 12/2000 | Lee ............................. 257/666 |

\* cited by examiner

Primary Examiner—Richard Elms
Assistant Examiner—Brad Smith
(74) Attorney, Agent, or Firm—Wood, Phillips, Katz, Clark & Mortimer (57) ABSTRACT

Leaded semiconductor packages and a method (80) of trimming and singulating such packages are described. The method (80) uses a panel (10) with lead frames (22) arrayed in a plurality of frame strips (24) for mounting a plurality of semiconductor dies (36). The panel (10) has a peripheral frame (26), a plurality of dam bars (28) disposed within the peripheral frame (26), a plurality of leads (30) extending transversely from portions of the plurality of dam bars (28) and a plurality of support bars (32) extending transversely from other portions of the plurality of dam bars (28). Primary tie bars (34) are formed at opposite ends of each of the plurality of frame strips (24). Slots (44) are disposed between lateral sides of the peripheral frame (26) and the plurality of frame strips (24).

5 Claims, 10 Drawing Sheets

LEADED SEMICONDUCTOR PACKAGES AND METHOD OF TRIMMING AND SINGULATING SUCH PACKAGES

FIELD OF THE INVENTION

This invention relates to leaded semiconductor packages d a method of trimming and singulating such packages using a panel with a plurality of lead frames.

BACKGROUND

Conventionally, formation of a leaded semiconductor package begins by mounting a semiconductor die to a lead frame. The mounting generally includes attaching the semiconductor die to a mounting paddle of the lead frame and wire bonding electrical contacts of the semiconductor die to leads of the lead frame. Upon mounting as such, the semiconductor die is molded with a protective cover to prevent contamination or to alleviate damage to the semiconductor die. The protective cover may be provided with, for example, an epoxy resin that requires a curing process. After the curing process, formation of the leaded semiconductor package is completed when the leads are trimmed and formed by, for example, punching to separate undesired portions of a lead frame.

Generally, a plurality of lead frames is arrayed on a panel so that more than one semiconductor die can be mounted for each panel. Following the formation steps described above, each semiconductor die is mounted onto a respective lead frame and molded together with other semiconductor dies on the panel. The panel is then trimmed and sawed to provide individual or singulated leaded semiconductor packages. Each of these singulated leaded semiconductor packages is functionally tested to check electrical performance of the semiconductor die mounted within.

In the above method to form a leaded semiconductor package, a mounting paddle supports a semiconductor die. However, other supporting materials such as, for example, an adhesive tape, can replace the mounting paddle to reduce thickness of the leaded semiconductor package. For example, U.S. Pat. No. 51286,679, issued to Farnworth et al on Feb. 15, 1994 and U.S. Pat. No. 5,729,049, issued to Corisis et al on Mar. 17, 1998, both assigned to Micron Technology, Inc., describe use of an adhesive tape in place of the mounting paddle. Also, U.S. Pat. No. 5,789,083, issued to Kinsman on Aug. 4, 1998 and assigned to Micron Technology, Inc., describes use of a support structure to support a semiconductor die during functional testing and that is removed during trim and form.

Although the above techniques are adopted to reduce the size of leaded semiconductor packages, further reduction in this size is likely to cause a problem in handling or transporting such packages. This is because existing equipment used in packaging and electrical testing requires modifications to accommodate smaller leaded semiconductor packages for such handling or transporting. These modifications can be expensive and are likely to incur development costs that increase the cost of a leaded semiconductor package.

In U.S. Pat. No. 5,926,380, issued to Kim on Jul. 20, 1999 and assigned to LG Semicon Co., Ltd., a lead frame lattice is used to assemble a plurality of integrated chips formed in a wafer. However, the integrated chips are sawn for functional testing and the problem described above still limits any reduction in the size of such integrated chips. Also, transport time to transport an integrated chip from a carrier to a test position and vice versa affects cycle time to form the integrated chip. Furthermore, lead-supporting bars of the lead frame lattice have to be sawn entirely to detach each of the plurality of integrated chips.

As consumer demands for smaller portable electronic devices increase, development of smaller leaded semiconductor packages helps to meet such demands. Therefore, in view of these consumer demands, a need clearly exists for a leaded semiconductor package that can be formed in a smaller size without being limited by existing equipment in terms of handling or transporting.

SUMMARY

In accordance with one aspect of the invention, there is disclosed a leaded semiconductor package comprising:
  a plurality of semiconductor dies; and
  a panel having lead frames arrayed in a plurality of frame strips for mounting the plurality of semiconductor dies, the panel including:
  a peripheral frame;
  a plurality of dam bars disposed within the peripheral frame;
  a plurality of leads extending transversely from portions of the plurality of dam bars; and
  a plurality of support bars extending transversely from other portions of the plurality of dam bars, wherein each of the plurality of support bars is non-contiguous between the plurality of dam bars;
  wherein the plurality of semiconductor dies are mounted to the lead frames, the panel being trimmed to form the plurality of leads respectively associated with each of the lead frames of each of the plurality of frame strips,
  further wherein the panel is sawed across the plurality of frame strips to singulate the lead frames and thereby form at least one of the leaded semiconductor package.

Optionally, opposite ends of. each of the plurality of frame strips can comprise at least one primary tie bar.

More optionally, each of the plurality of frame strips can comprise at least one mounting paddle, the at least one mounting paddle being disposed between the opposite ends.

Generally, adjacent ones of the at least one mounting paddle can be connected by a secondary tie bar.

More generally, the other portions of the plurality of dam bars can be disposed between adjacent lead frames.

Optionally, the panel can further include at least one slot disposed between at least one side of the peripheral frame and the lead frames.

More optionally, the panel can further include at least one slot disposed between adjacent ones of the plurality of frame strips.

In accordance with another aspect of the invention, there is disclosed a method of trimming and singulating leaded semiconductor packages, the method comprising the steps of:
  mounting a plurality of semiconductor dies onto lead frames of a panel, the lead frames being arrayed in a plurality of frame strips, each of the lead frames having a plurality of leads;
  trimming by punching the panel to form the plurality of leads for each of the lead frames; and
  sawing across the plurality of frame strips to singulate the lead frames and thereby form the leaded semiconductor packages.

Generally, the sawing step can comprise the step of sawing along each of a plurality of support bars extending transversely from a plurality of dam bars, the plurality of dam bars being disposed within a peripheral frame of the panel.

Optionally, the method can further comprise the step of functionally testing one or more of the plurality of semiconductor dies mounted on the lead frames prior to the sawing step.

Generally, the mounting step can comprise the step of attaching an adhesive side of at least one single-sided adhesive tape to a planar side of the panel.

Optionally, the attaching step can comprise the step of aligning the at least one single-sided adhesive tape with each of the plurality of frame strips.

Generally, the mounting step can further comprise the step of affixing each of the plurality of semiconductor dies onto the adhesive side of the at least one single-sided adhesive tape.

More generally, the mounting step can further comprise the step of electrically connecting the plurality of semiconductor dies to the plurality of leads of respective the lead frames.

Optionally, the mounting step can further comprise the step of molding each of the plurality of semiconductor dies after the electrically connecting step.

More optionally, the mounting step can further comprise the step of removing the at least one single-sided adhesive tape after the molding step.

BRIEF DESCRIPTION OF THE DRAWINGS

Embodiments of the invention are described hereinafter with reference to the drawings, in which.

DETAILED DESCRIPTION

Leaded semiconductor packages and a method of trimming and sawing to singulate the leaded semiconductor packages in accordance with preferred embodiments of the invention are described. In the following, numerous details are provided for a more thorough description. It shall be apparent to one skilled in the art, however, that the invention may be practised without such details. In other instances, well-known details have not been described at length so as not to obscure the invention.

The advantages of the preferred embodiments of the invention are manifold. One advantage of the preferred embodiments of the invention is that leaded semiconductor packages are easier to handle and transport when connected together in a panel. Consequently, leaded semiconductor packages can be formed in a smaller size without being limited by existing equipment in terms of handling or transporting.

In addition to ease of handling or transporting, another advantage of the preferred embodiments of the invention is that functional testing can be performed before leaded semiconductor packages of a panel are singulated. This reduces transport time compared to functionally testing each leaded semiconductor package after singulation. Also, time for the functional testing can be reduced by simultaneously testing more than one leaded semiconductor package at a time. Thus, in the preferred embodiments of the invention, cycle time to form a leaded semiconductor package is reduced compared to existing functional testing.

Yet another advantage of the preferred embodiments of the invention is that the concept of punching and saw singulation, which is possible as a result of using such a panel, allows a higher throughput in forming the leaded semiconductor packages as well as minimising tooling cost required for each package size. This is because more leaded semiconductor packages can be transported and handled with each panel of the preferred embodiments of the invention compared to existing panels. Furthermore, there is no need to change existing tools for transporting and handling the panel of the preferred embodiments of the invention. Hence, overall cost of each of the leaded semiconductor packages is reduced.

A still further advantage of the preferred embodiments of the invention is that, in addition to stiffening the panel for easier sawing, the plurality of support bars also serves as guides to align sawing blades to sawing directions.

Further advantageously, the support bars in the present invention also serve to stiffen the panel against stress that is typically encountered when the saw blades rotate against the panel during sawing.

Figure 1:
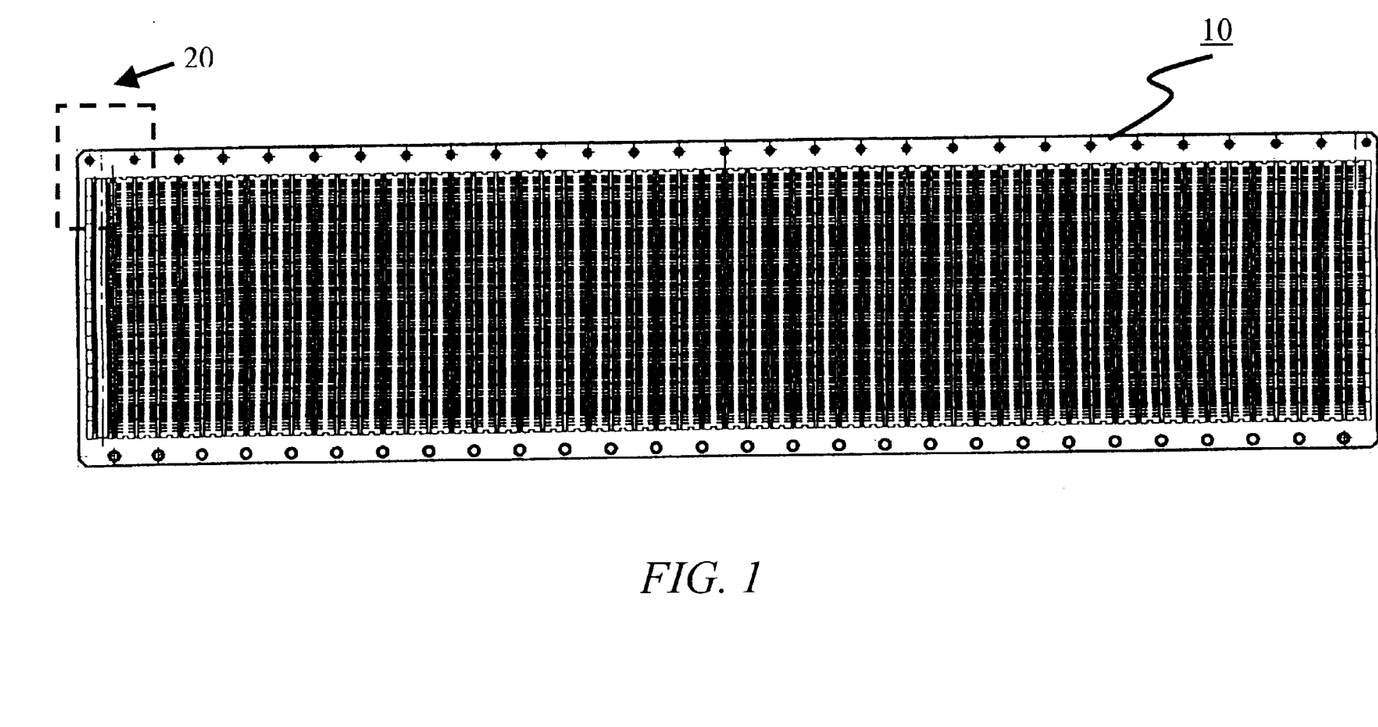
FIG. 1 is a plan view of a panel in accordance with a preferred embodiment of the invention.
Figure 2:
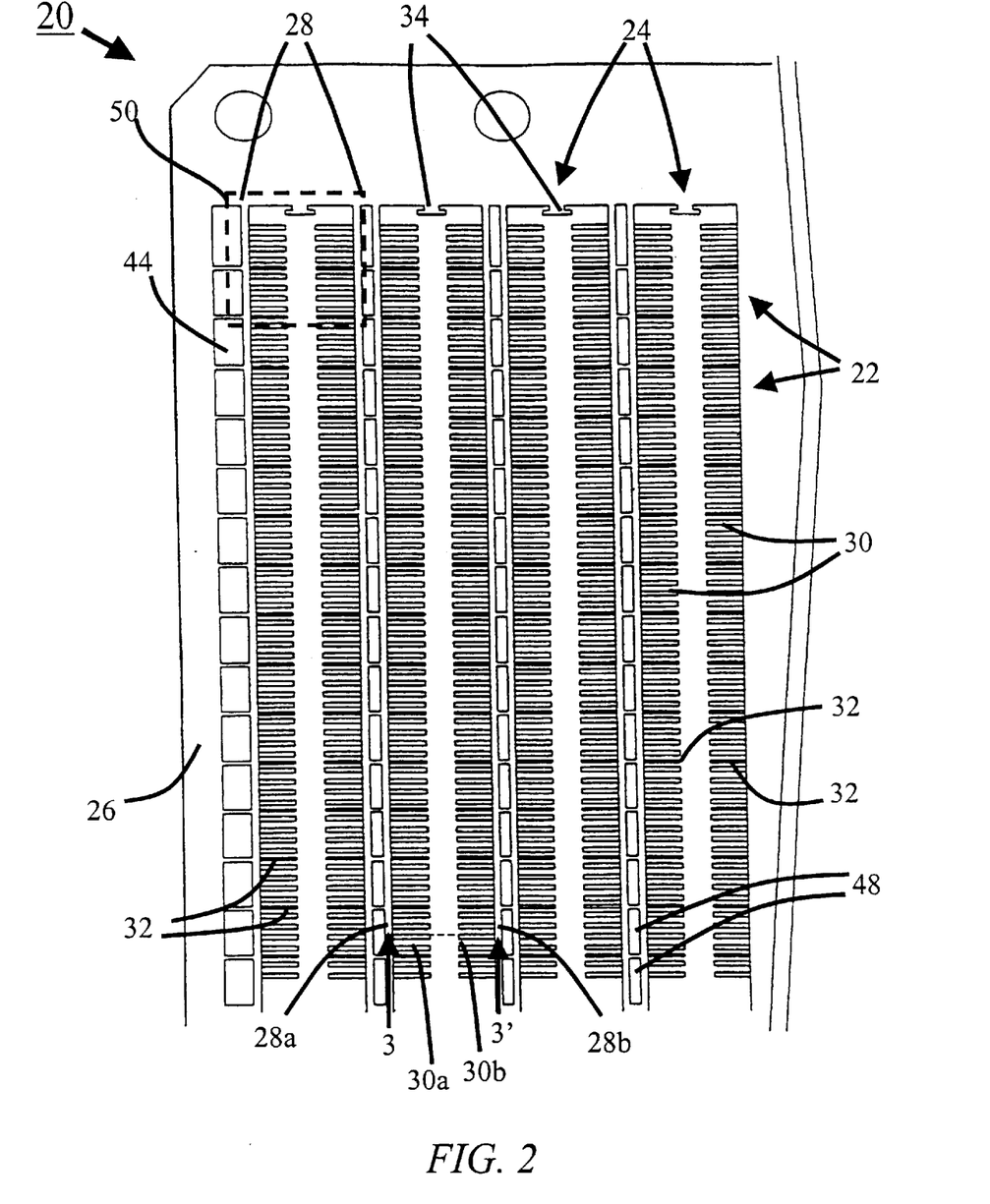
FIG. 2 is an enlarged view of a portion of the panel of FIG. 1.

Referring now to FIG. 1, a plan view of a panel 10 in accordance with a preferred embodiment of the invention is illustrated. To better illustrate the panel 10, an enlarged view of a portion 20 of the panel 10 is shown in FIG. 2. The panel 10 has lead frames 22 arrayed in a plurality of frame strips 24 for mounting a plurality of semiconductor dies (not shown). The panel 10 includes a peripheral frame 26, a plurality of dam bars 28 disposed within the peripheral frame 26, a plurality of leads 30 extending transversely from portions of the plurality of dam bars 28 and a plurality of support bars 32 extending transversely from other portions of the plurality of dam bars 28. Primary tie bars 34 are formed at opposite ends of each of the plurality of frame strips 24.

Figure 3:
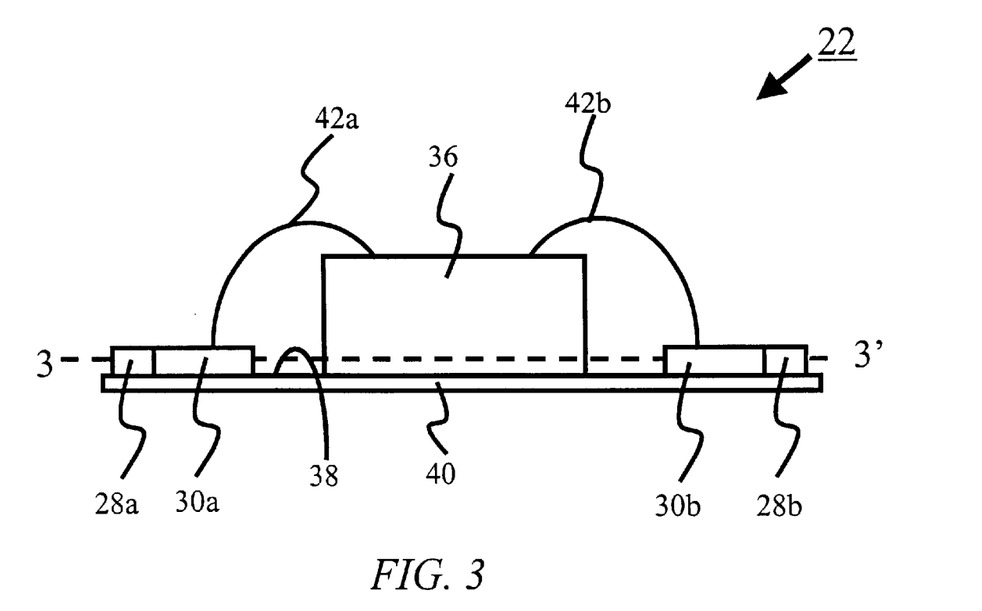
FIG. 3 is a cross-sectional view of a lead frame of the panel of FIG. 2 along line 3—3' illustrating a semiconductor die mounted thereat.

A cross-sectional view along line 3—3' of a lead frame 22 of the panel 10 is illustrated in FIG. 3 with a semiconductor die 36 mounted thereat. The semiconductor die 36 is affixed onto an adhesive side 38 of a single-sided adhesive tape 40. The semiconductor die 36 electrically connects to two leads 30a,30b respectively via wires 42a,42b.

Slots 44 are disposed between sides of the peripheral frame 26 and the plurality of frame strips 24. A slot 44 is indicated in FIG. 2 on the left side of the portion 20. The purpose of these slots 44 is to absorb thermal stress caused by different coefficients of thermal expansion of different materials used with packaging of the panel 10. Also, intermediate slots 48 are disposed between dam bars 28a,28b to absorb thermal stress for each of the plurality of frame strips 24.

Figure 4:
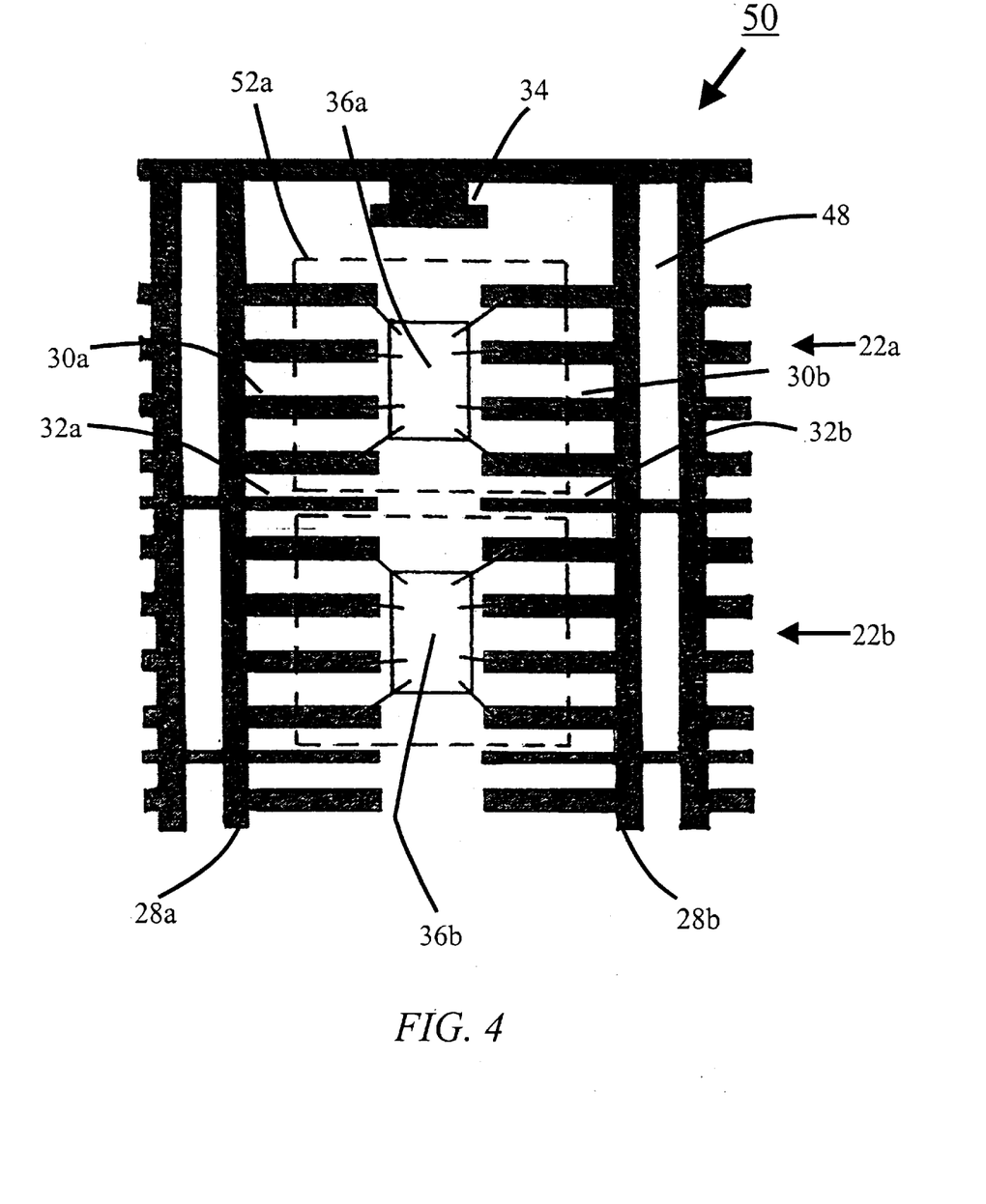
FIG. 4 is an enlarged view of a section of the portion of FIG. 2 showing two lead frames.

Referring now to FIG. 4, an enlarged view of a section 50 of the portion 20 shows two lead frames 22a,22b. Each of the plurality of support bars 32 is noncontiguous between the plurality of dam bars 28 that support leads 30 on opposing sides of the lead frames 22a,22b. Hence, a support bar 32a extending from a dam bar 28a is not connected to another support bar 32b extending from another dam bar 28b. It is to be noted that the tie bar 34 that is illustrated in FIG. 4 is outside the body outline 52a and is not a part of the lead frame 22a.

Figure 5:
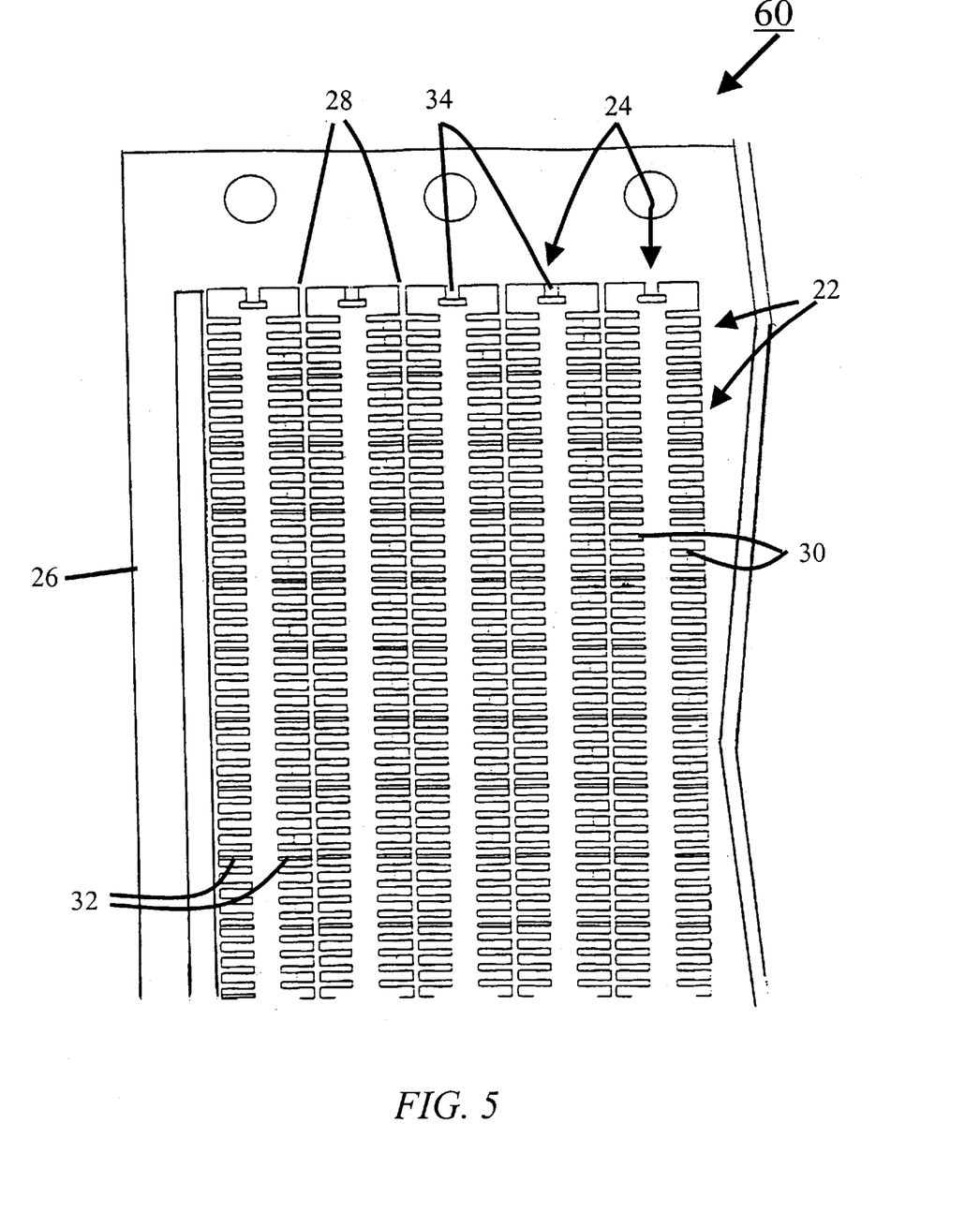
FIG. 5 is plan view of a portion of a panel in accordance with another embodiment of the invention.
Figure 6:
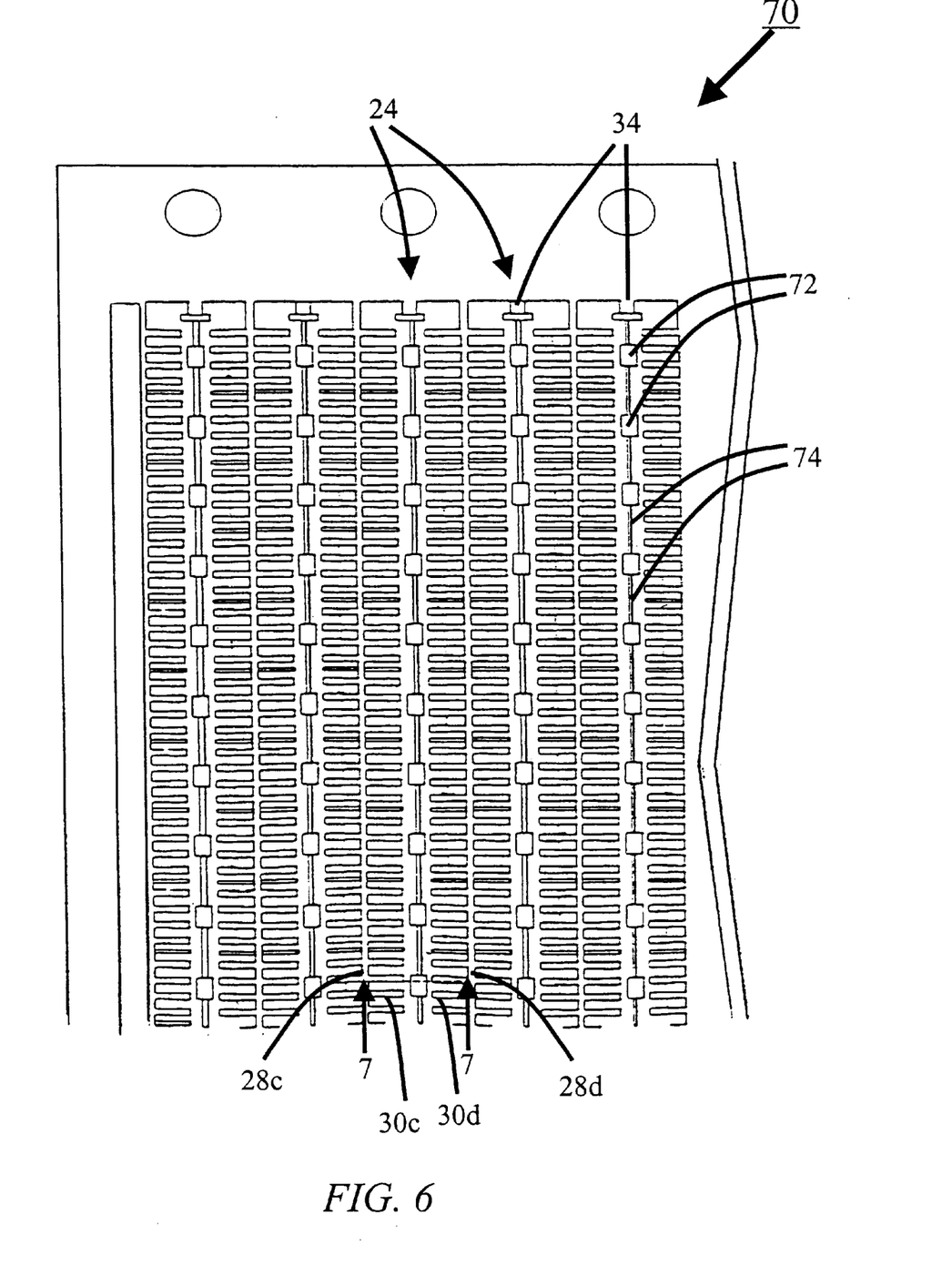
FIG. 6 is plan view of a portion of a panel in accordance with yet another embodiment of the invention.

The plurality of frame strips 24 without the intermediate slots 48 is shown in FIG. 5 for a panel 60 in accordance with another embodiment of the invention. In accordance with yet another embodiment of the invention, FIG. 6 shows a portion of a panel 70 having a plurality of mounting paddles 72 for mounting a plurality of semiconductor dies (not shown). The panel 70 also does not have the intermediate slots 48 as in the panel 10. Secondary tie bars 74 connect adjacent ones of the mounting paddles 72.

Figure 7:
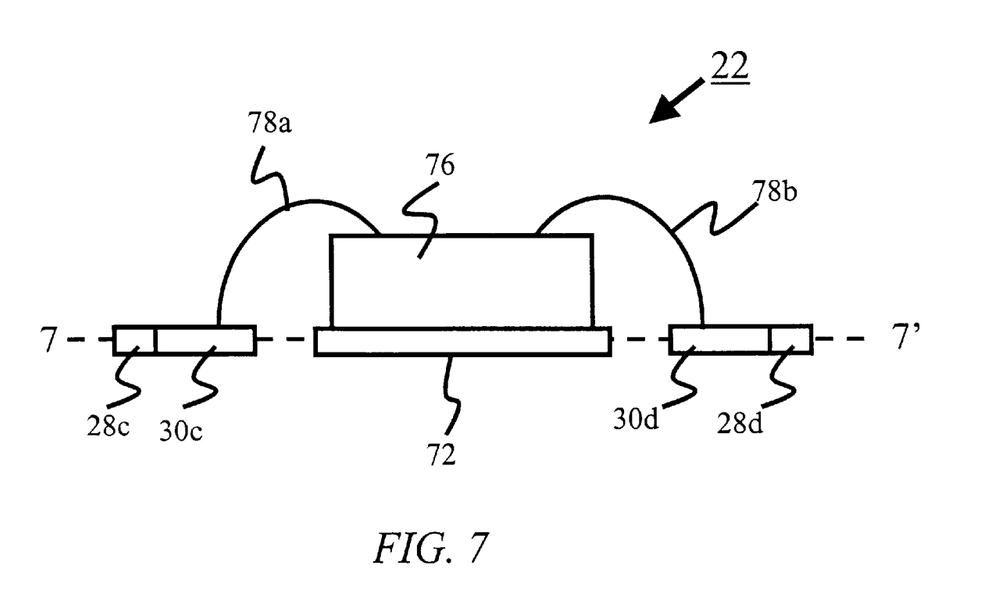
FIG. 7 is a cross-sectional view of a lead frame of the panel of FIG. 6 along line 7—7' illustrating a semiconductor die mounted thereat.

For the panel 70, FIG. 7 illustrates a cross-sectional view of a lead frame 22 along line 7—7' having a semiconductor die 76 mounted to a mounting paddle 72. In this view, the semiconductor die 76 is wire-bonded with wires 78a,78b to leads 30c,30d respectively. The leads 30c,30d extend from dam bars 28c,28d respectively.

The panel 10 is illustrated without mounting paddles for mounting the plurality of semiconductor dies. However, such mounting paddles can be formed on the panel 10 by extending secondary tie bars 74 from primary tie bars 34 disposed at opposite ends of each of the plurality of frame strips 24.

Figure 8:
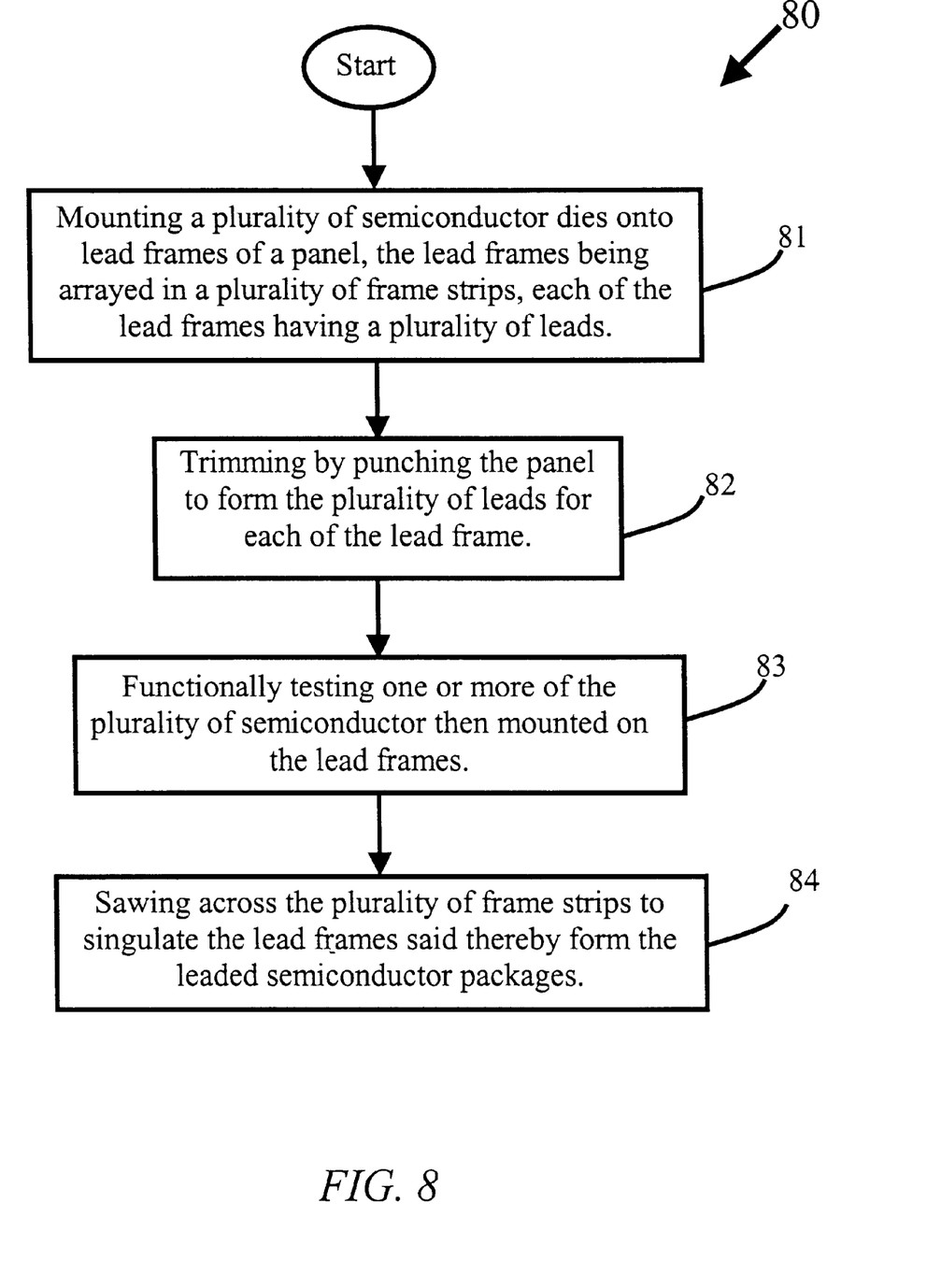
FIG. 8 is a flow chart illustrating a method of trimming and singulating leaded semiconductor packages mounted on the panel of FIG. 1.

A method 80 of trimming and singulating leaded semiconductor packages using the panel 10 is illustrated with a flow chart in FIG. 8. The method 80 begins at step 81 in which a plurality of semiconductor dies 36 is mounted onto the lead frames 22 of the panel 10. Mounting includes attaching the adhesive side 38 of the single-sided adhesive tape 40 to a planar side of the panel 10. Depending on the width of the planar side, one or more of the single-sided adhesive tape 40 is used. For example, if more than one single-sided adhesive tape 40 is to be used, then each single-sided adhesive tape 40 needs to be aligned with each of the plurality of frame strips 24.

Upon attaching the single-sided adhesive tape 40, each of the plurality of semiconductor dies 36 is then affixed onto the adhesive side 38. Mounting then continues with electrically connecting the plurality of semiconductor dies 36 to the plurality of leads 30 of respective lead frames 22.

One technique to electrically connect the plurality of semiconductor dies 36 to the plurality of leads 30 is, for example, by wire bonding. As is known in the art, wire bonding bonds electrical contacts of the plurality of semiconductor dies 36 to the plurality of leads 30. Mounting further comprises molding each of the plurality of semiconductor dies 36 after electrically connecting the plurality of semiconductor dies 36 to the plurality of leads 30. Upon molding, the single-sided adhesive tape 40 is removed as a molding compound applied in the molding step now provides support for the plurality of semiconductor dies 36 in the lead frames 22.

Upon mounting the plurality of semiconductor dies 36 onto the lead frames 22 of the panel 10, the leads 30 of the lead frames 22 are trimmed at step 82 by punching. After trimming the leads 30 for every lead frame 22 of the panel 10, a panellised array of leaded semiconductor packages is formed. In the trimming step 82, the support bars 32 associated with each of the plurality of frame strips 24 are not trimmed. Hence, the support bars 32 connect the plurality of frame strips 24 to each other and serve as boundaries between each of the leaded semiconductor packages.

The method 80 continues to step 83 in which one or more of the semiconductor dies 36 respectively associated with the leaded semiconductor packages of the panel 10 are functionally tested. As the leaded semiconductor packages are still attached on the panel 10 by the support bars 32, handling or transporting the leaded semiconductor packages as a panel is easier than handling or transporting individual leaded semiconductor packages that have been depanellised or singulated.

After the testing step 83, the method 80 continues to step 84 in which the leaded semiconductor packages of the panel 10 are singulated. Singulation of the leaded semiconductor packages is performed by sawing across the plurality of frame strips 24 along the support bars 32. It is to be noted that the support bars 32 should be thinner than the width of saw blades used in the sawing step 84. This is so that burrs are not formed along edges of each of the leaded semiconductor packages after the sawing step 84.

It is to be noted that in describing the steps of the method 80, the panel 10 is used as an illustrative example only. Therefore, variations in the steps of the method 80 are expected when the other panels 60,70 are used. For example, when each of the lead frames 22 includes a mounting paddle 72, then an epoxy resin or a double-sided adhesive tape may be applied to affix a semiconductor die 36 to the mounting paddle.

The sequential formation of the leaded semiconductor packages using the method 80 for the panel 70 is illustrated in FIG. 9A to FIG. 9D. In describing the sequential formation, only four leaded semiconductor packages are indicated to simplify FIG. 9A to FIG. 9D.

Figure 9A:
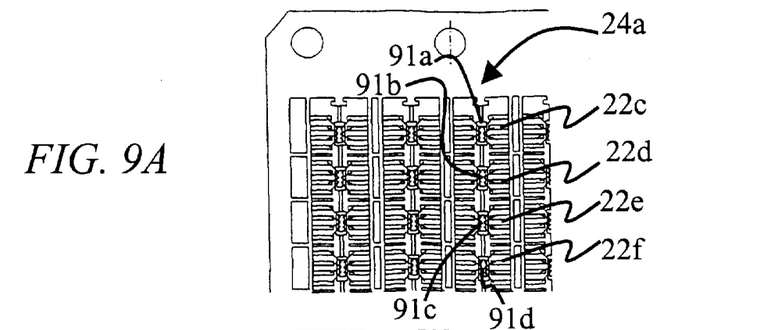
FIG. 9A to FIG. 9D illustrates various stages in forming the leaded semiconductor packages using the method of FIG. 8.
Figure 9B:
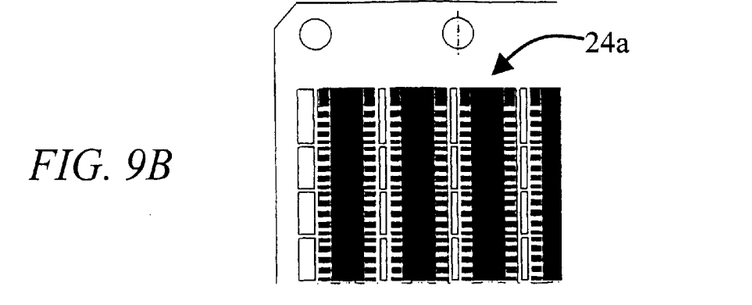
Figure 9C:
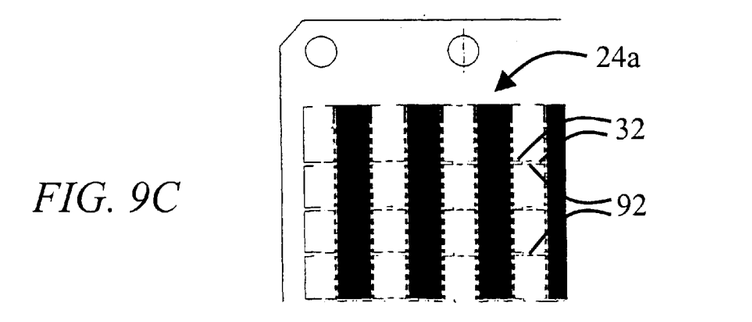

Accordingly, FIG. 9A shows four semiconductor dies 91a,91b,91c,91d after mounting to respective lead frames 22c,22d,22e,22f of a frame strip 24a and wire bonding. These four mounted semiconductor dies 91a,91b,91c,91d are then molded as shown but not indicated in FIG. 9B. Upon the trimming step 82, the leads 30 are trimmed and formed as illustrated in FIG. 9C. As shown in FIG. 9C, the support bars 32 are still attached to other portions 92 of the dam bars 28 and have not been removed from each of the plurality of frame strips 24 in the trimming step 82.

Figure 9D:
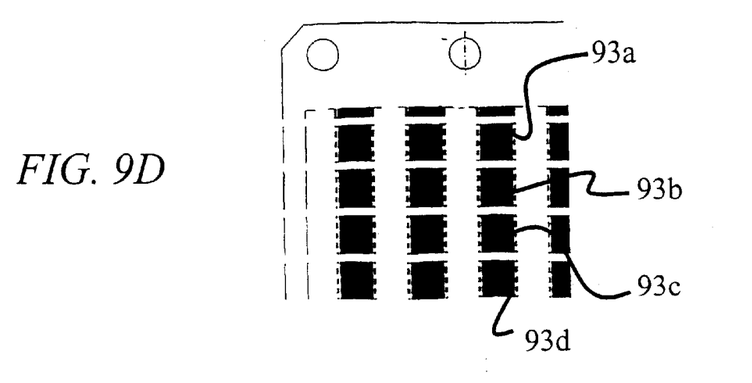

After the semiconductor dies 91a,91b,91c,91d are functionally tested, the four leaded semiconductor packages of the frame strip 24a are singulated to provide four leaded semiconductor packages 93a,93b,93c,93d that are now singulated in step 84 as shown in FIG. 9D.

Figures 10A, 10B:
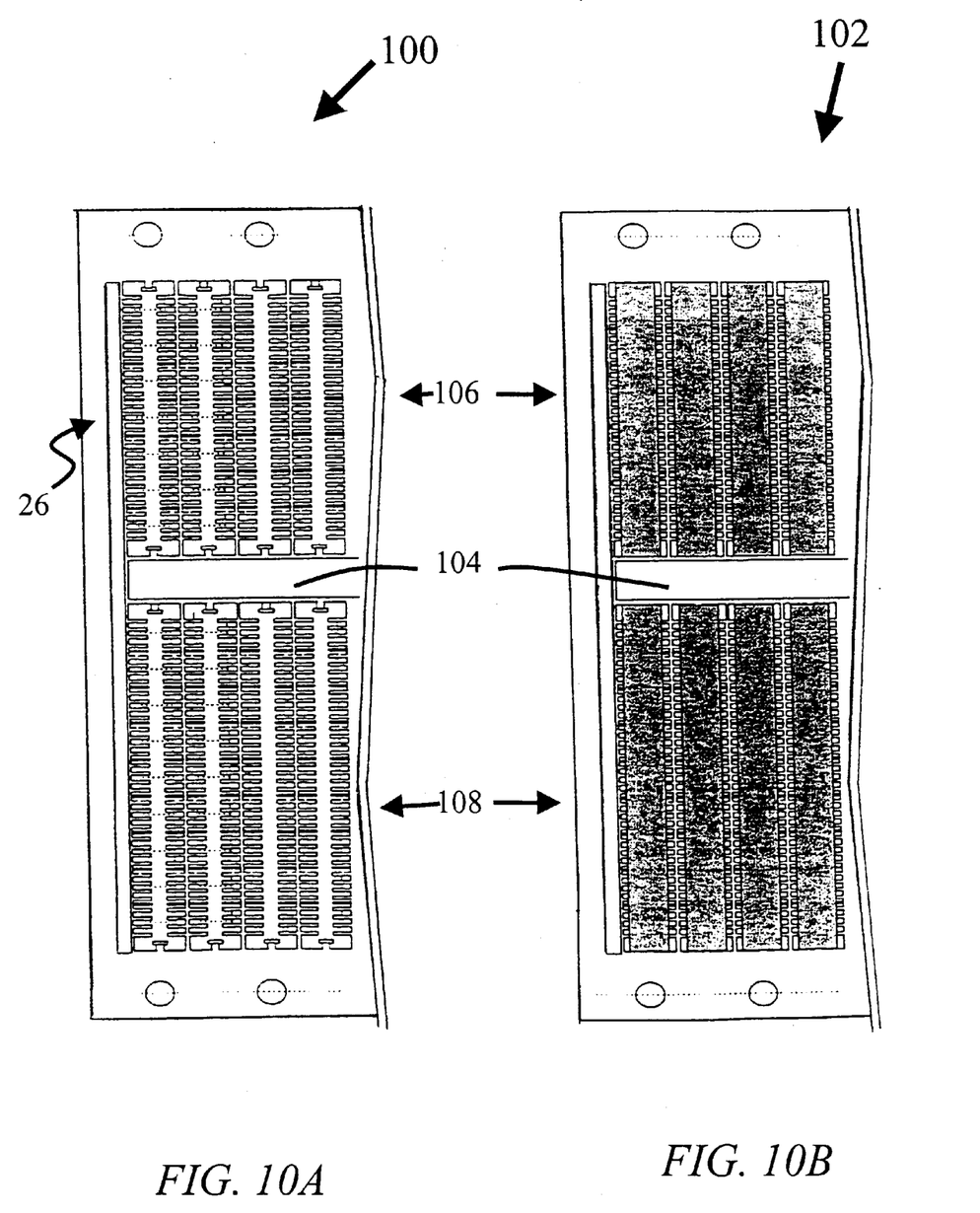
FIG. 10A and FIG. 10B are plan views of a panel with and without adhesive tapes, respectively, in accordance with further alternate embodiments of the invention.

Referring now to FIG. 10A and FIG. 10B, plan views of panels 100,102 with and without adhesive tapes, respectively, in accordance with further alternate embodiments of the invention are illustrated. In these two panels 100,102, an intermediate slot 104 is disposed between two sets of frame strips 106,108.

Figure 11A:
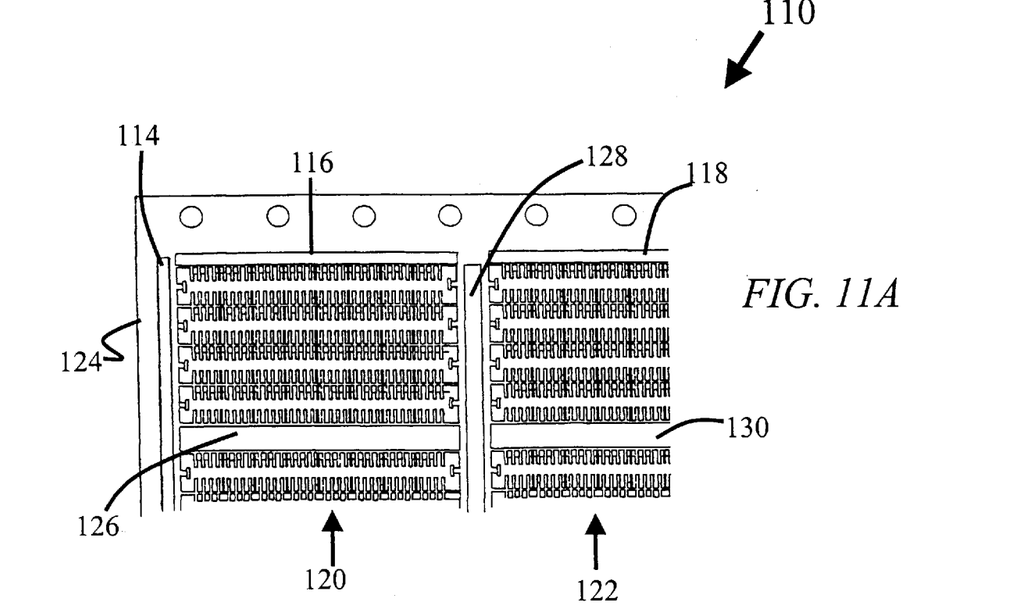
FIG. 11A and FIG. 11B are plan views of a panel with and without adhesive tapes, respectively, in accordance with still further alternate embodiments of the invention.
Figure 11B:
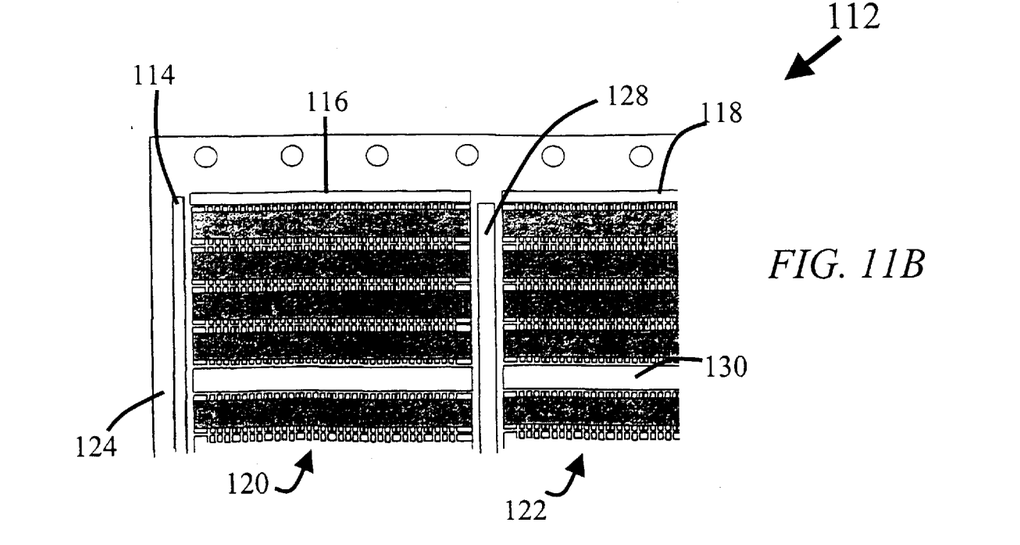

FIG. 11A and FIG. 11B are plan views of panels 110,112 with and without adhesive tapes, respectively, in accordance with still further alternate embodiments of the invention. In these two panels 110,112, peripheral slots 114,116,118 are disposed between two sets of frame strips 120,122 and a peripheral frame 124 of the panel 110. In addition, intermediate slots 126,128,130 are disposed between and within the two sets of frame strips 120,122.

In the panels 100,102,110,112, the intermediate slots 104,126,128,130 and the peripheral slots 114,116,118 serve as a buffer between sets of frame strips 106,108,120,122. The intermediate slots 104,126,128,130 enable easier deposition or injection of a mold compound as well as better control of the semiconductor packages to reduce warpage caused by different coefficient of thermal expansion in material used in packaging the panels 100,102,110,112. This is because frame strips for the panels 100,102,110,112 are shorter compared to frame strips 24 of the panel 10. Consequently, the mold compound used in the panels 100,102,110,112 needs to transverse a shorter distance along the frame strips of the panels 100,102,110,112 than that of the panel 10.

In the foregoing description, leaded semiconductor packages and a method of forming such leaded semiconductor packages are described. Although preferred embodiments are described, it shall be apparent to one skilled in the art in view of these preferred embodiments that numerous changes and/or modifications can be made without departing from the scope and spirit of the invention.

What is claimed is:

1. A leaded semiconductor package comprising:
   a plurality of semiconductor dies; and
   a panel having lead frames arrayed in a plurality of frame, said plurality of semiconductor dies being mounted to said lead frames, each of said plurality of frame strips comprising at least one mounting paddle disposed between opposite ends of each frame strip, adjacent ones of said at least one paddle being connected by a tie bar, said panel including
   a peripheral frame;
   a plurality of dam bars disposed within said peripheral frame;
   a plurality of leads extending transversely from portions of said plurality of dam bars; and
   a plurality of support bars extending transversely from other portions of said plurality of dam bars, wherein each of said plurality of support bars is non-contiguous between said plurality of dam bars.

2. The leaded semiconductor package as claimed in claim 1, wherein said opposite ends of each of said plurality of frame strips comprises at least one further tie bar.

3. The leaded semiconductor package as claimed in claim 1, wherein said other portions of said plurality of dam bars are disposed between adjacent lead frames.

4. The leaded semiconductor package as claimed in claim 1, wherein said panel further includes at least one slot disposed between at least one side of said peripheral frame and said lead frames.

5. The leaded semiconductor package as claimed in claim 1, wherein said panel further includes at least one slot disposed between adjacent ones of said plurality of frame strips.

* * * * *